(12) United States Patent
Moua et al.

(10) Patent No.: US 9,947,493 B2
(45) Date of Patent: *Apr. 17, 2018

(54) MAGNETICALLY BIASED RETRACTING KEY ASSEMBLY AND KEYBOARD

(71) Applicant: SYNAPTICS INCORPORATED, San Jose, CA (US)

(72) Inventors: VanDee Moua, Spokane Valley, WA (US); Douglas Krumpelman, Hayden, ID (US); Peter Bokma, Coeur D'Alene, ID (US); Robert J. Bolender, San Jose, CA (US); Chris Weber, Coeur D'Alene, ID (US)

(73) Assignee: Synaptics Incorporated, San Jose, CA (US)

( * ) Notice: Subject to any disclaimer, the term of this patent is extended or adjusted under 35 U.S.C. 154(b) by 720 days.

This patent is subject to a terminal disclaimer.

(21) Appl. No.: 14/523,208

(22) Filed: Oct. 24, 2014

(65) Prior Publication Data

US 2016/0118203 A1 Apr. 28, 2016

(51) Int. Cl.
*H03K 17/94* (2006.01)
*H01H 13/705* (2006.01)
(Continued)

(52) U.S. Cl.
CPC .......... *H01H 13/705* (2013.01); *H01H 13/14* (2013.01); *H03K 17/98* (2013.01); *H01H 2221/024* (2013.01); *H01H 2221/04* (2013.01)

(58) Field of Classification Search
None
See application file for complete search history.

(56) References Cited

U.S. PATENT DOCUMENTS 5,424,516 A 6/1995 Emmons
5,463,388 A 10/1995 Boie et al.
(Continued)

OTHER PUBLICATIONS

International Searching Authority, Korean Intellectual Property Office, International Search Report and Written Opinion for International Application No. PCT/US2014/010172, dated May 19, 2014.
(Continued)

*Primary Examiner* — Joseph Feild
*Assistant Examiner* — Kevin Lau
(74) *Attorney, Agent, or Firm* — FBFK PC

(57) ABSTRACT

Magnetically biased retracting key assemblies and keyboards are provided. A key assembly includes a touch surface for receiving a press input from a user and a planar-translation-effecting (PTE) mechanism configured to guide as the keycap moves from an un-pressed position toward a pressed position. The key assembly also includes a ready-return mechanism configured to magnetically biased the keycap in the un-pressed position, the ready-return mechanism including a slider mechanism positioned beneath the keycap and coupled to the PTE mechanism. When the press surface receives a press input the slider mechanism translates away from the magnet as the PTE mechanism guides the keycap from the un-pressed position toward the pressed position. In some embodiments, the PTE mechanism and the ready-return mechanism translate with respect to a chassis layer providing a key retraction feature for the key assembly or keyboard.

22 Claims, 14 Drawing Sheets

(51) Int. Cl.
*H01H 13/14* (2006.01)
*H03K 17/98* (2006.01)

(56) References Cited

U.S. PATENT DOCUMENTS

| | | |
|---|---|---|
| 5,667,061 A | 9/1997 | Lee |
| 2001/0000125 A1 | 4/2001 | Zimmerman et al. |
| 2007/0273560 A1 | 11/2007 | Hua et al. |
| 2008/0192012 A1* | 8/2008 | Chang .................. G06F 3/0219 345/169 |
| 2008/0264770 A1 | 10/2008 | Purcocks |
| 2010/0243420 A1 | 9/2010 | Lin |
| 2011/0303521 A1 | 12/2011 | Niu et al. |
| 2012/0001775 A1 | 1/2012 | Sellers |
| 2012/0228111 A1 | 9/2012 | Peterson et al. |
| 2012/0268384 A1 | 10/2012 | Peterson et al. |
| 2012/0299832 A1* | 11/2012 | Peterson ............... G06F 3/0202 345/168 |
| 2014/0125436 A1 | 5/2014 | Kinoshita et al. |
| 2014/0151204 A1 | 6/2014 | Chen |
| 2014/0168875 A1 | 6/2014 | Nakamura |
| 2014/0367236 A1* | 12/2014 | Chiang ................ H01H 13/705 200/344 |

OTHER PUBLICATIONS

International Searching Authority, Korean Intellectual Property Office, International Search Report and Written Opinion for International Application No. PCT/US2014/010196, dated Jun. 3, 2014.

\* cited by examiner

MAGNETICALLY BIASED RETRACTING KEY ASSEMBLY AND KEYBOARD

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Magnetically biased retracting key assemblies and keyboards are provided. In an embodiment, a key assembly includes a touch surface for receiving a press input from a user and a planar-translation-effecting (PTE) mechanism configured to guide the keycap in a press direction and a second direction orthogonal to the press direction as the keycap moves from an un-pressed position toward a press position. The key assembly also includes a ready-return mechanism configured to magnetically bias the keycap in the un-pressed position, the ready-return mechanism including a slider mechanism positioned beneath the keycap and coupled to one of the keycap and the PTE mechanism. When the press surface receives a press input sufficient to overcome the magnetic attraction between the slider mechanism and the magnet, the slider mechanism translates away from the magnet as the PTE mechanism guides the keycap from the un-pressed position toward the pressed position.

In some embodiments, the PTE mechanism and the ready-return mechanism translate with respect to a chassis layer providing a key retraction feature for the key assembly or keyboard.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
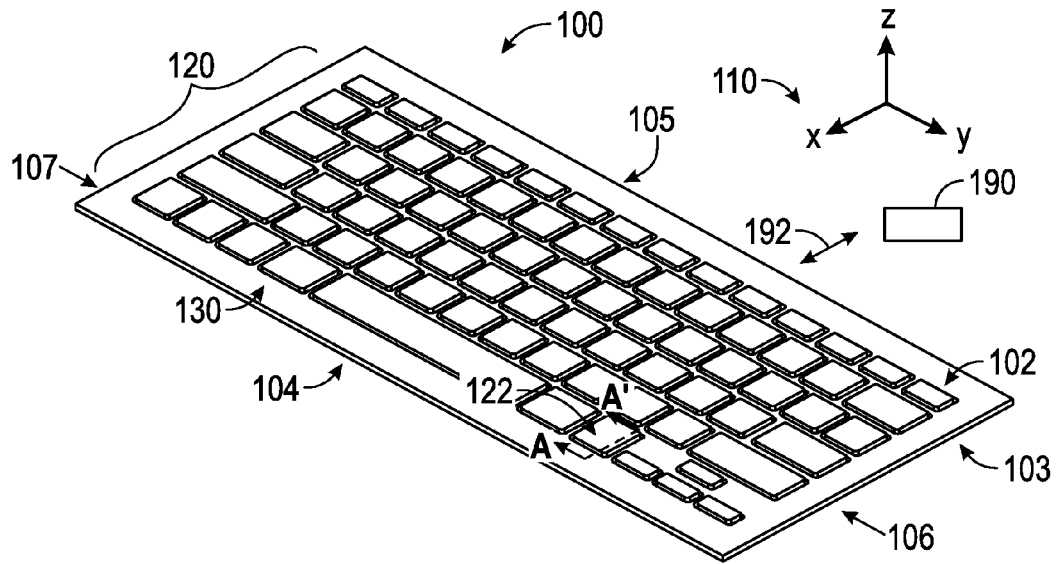
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user hovering over but not contacting a touch surface. As another example, a capacitive sensor system may be able to detect a user lightly touching a touchsurface, such that the user performs a non-press contact on the touchsurface, and does not depress the touchsurface sufficiently to be considered a press. Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s). These types of systems can support multi-stage touchsurface input by distinguishing and responding differently to two or more of the following: non-contact hover, non-press contact, and one, two, or more levels of press.

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be communicably coupled with a processing system 190 through communications channel 192. Connection 192 may be wired or wireless. The processing system 190 may comprise one or more ICs (integrated circuits) having appropriate processor-executable instructions for operating the keyboard 100, such as instructions for operating key press sensors, processing sensor signals, responding to key presses, and the like. In some embodiments, the keyboard 100 is integrated in a laptop computer or a tablet computer cover, and the processing system 190 comprises an IC containing instructions to operate keyboard sensors to determine the extent keys has been touched or pressed, and to provide an indication of touch or press status to a main CPU of the laptop or tablet computer, or to a user of the laptop or tablet computer.

While the orientation terminology, vertical-lateral travel, sensing technology, and implementation options discussed here focuses on the keyboard 100, these discussions are readily analogized to other touchsurfaces and devices described herein.

Figure 2:
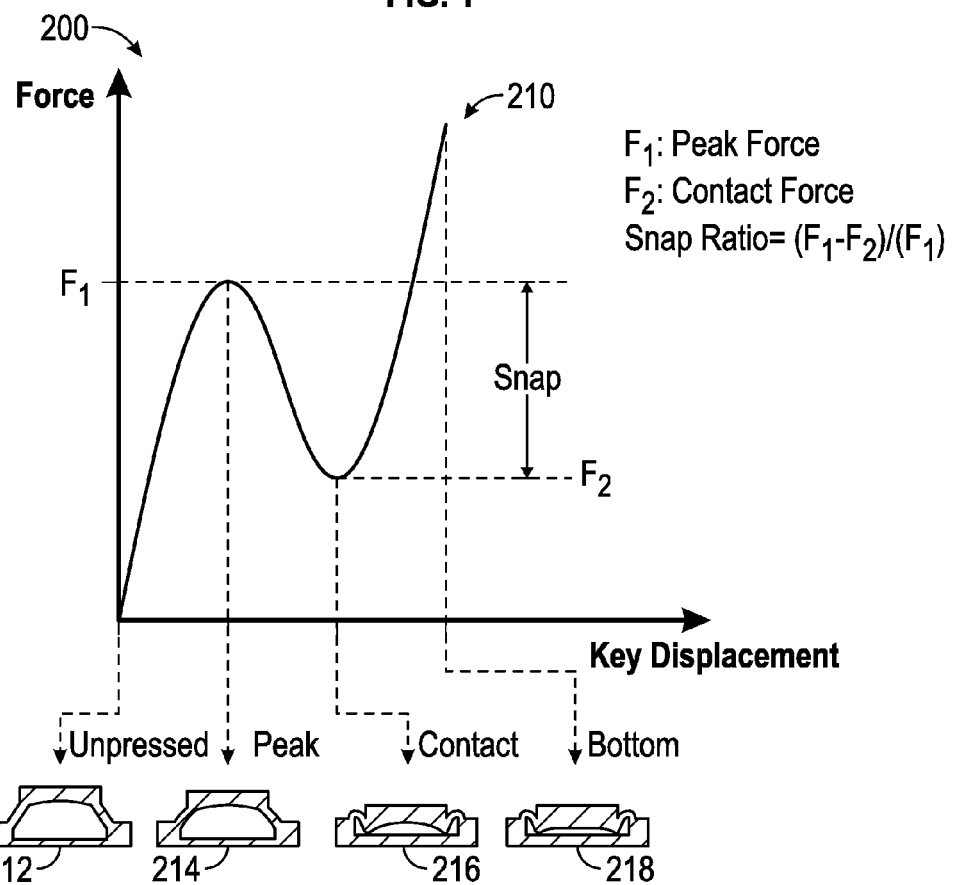
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
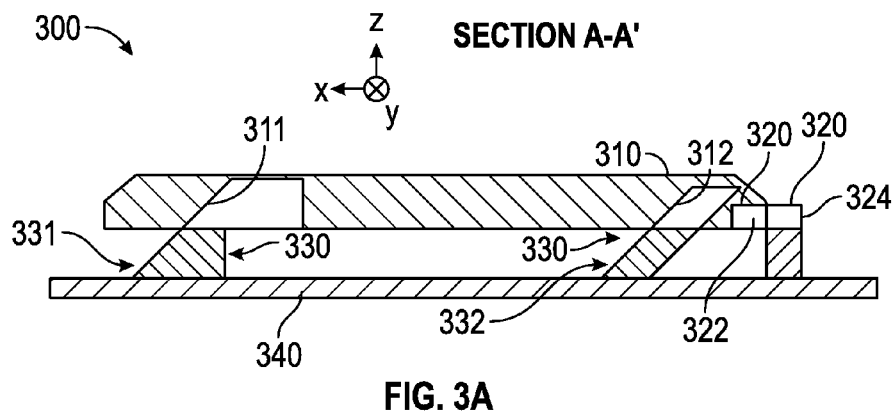
FIGS. 3A and 3B are simplified side views of a first example key assembly configured in accordance with the techniques described herein.
Figure 3B:
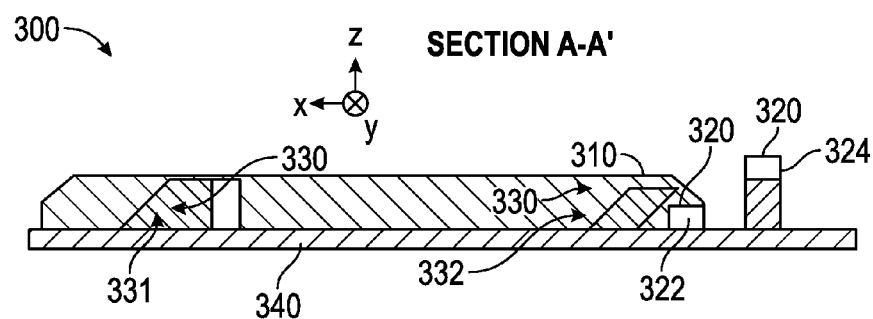

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these Figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

Figure 3C:
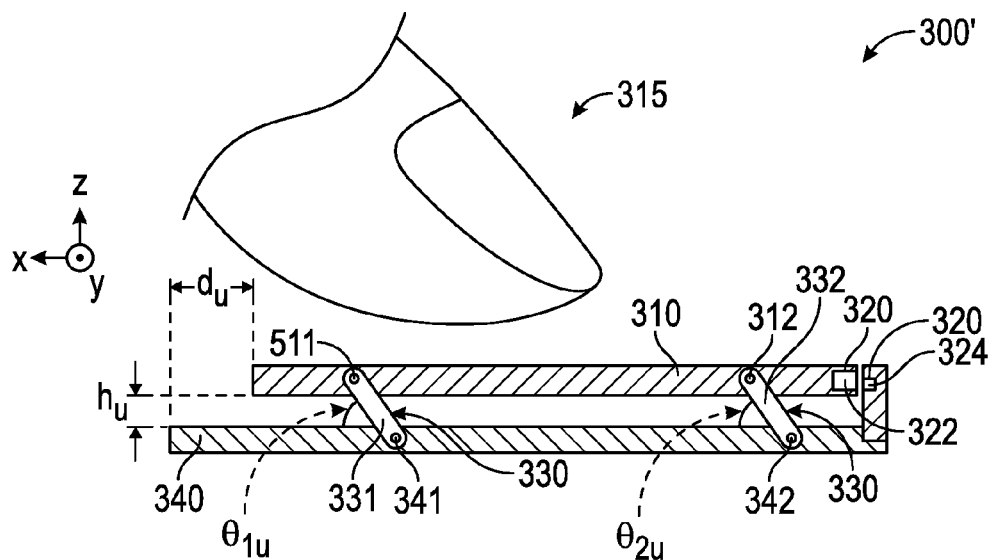
FIGS. 3C and 3D are simplified side views of a second example key assembly configured in accordance with the techniques described herein.
Figure 3D:
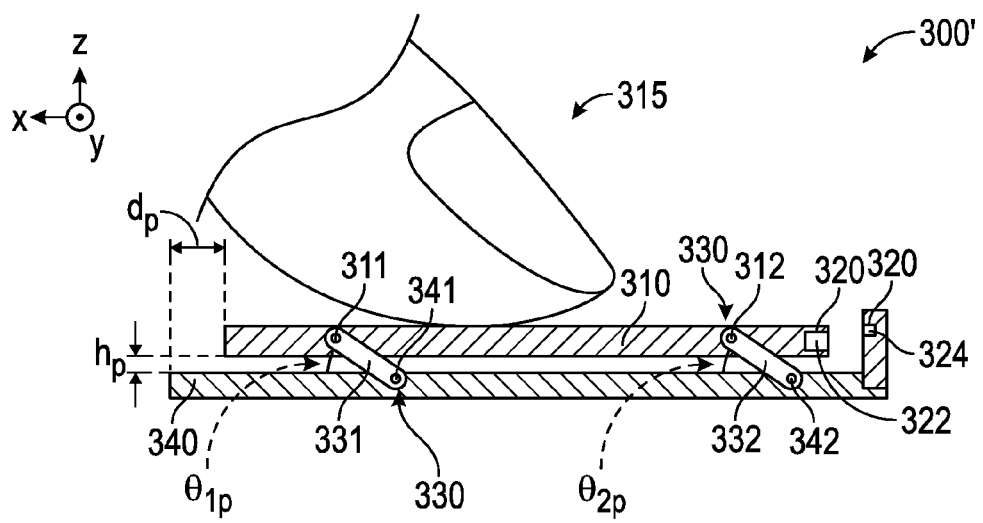

FIGS. 3C-3D illustrate simplified cross-sectional views of another embodiment of a touchsurface assembly. Specifically, FIGS. 3C-3D show a key assembly 300' that may be used to implement the key 122 of the keyboard 100, and illustrate A-A' sectional views of the key 122. A finger 355 is also shown to help convey orientation. FIG. 3C shows the key assembly 300' in an unpressed position and FIG. 3D shows the same key assembly 300' in a pressed position. The key assembly 300' may also be used in other devices utilizing keys, including keyboards other than the keyboard 100 and any other appropriate key-using device. Further, assemblies analogous to the key assembly 300' may be used to enable non-key, pressable touchsurface assemblies such as buttons, opaque touchpads, touchscreens, or any of the touch-enabled systems described herein.

The key assembly 300' comprises a keycap 350 that is visible to users and configured to be pressed by users, a ready/return mechanism 360, and a base 380. The ready/return mechanism 360 comprises magnetically coupled components 362, 364. The keycap 350, ready/return mechanism 360, and base 380 of the key assembly 300' are similar to the keycap 310, ready/return mechanism 320, and base 340 of the key assembly 300 in FIGS. 3A-3B. Thus, the descriptions of these components of the key assembly 300 and associate variations and alternatives can be readily applied to these analogous structures of the key assembly 300'. As an example application of the discussion of key assembly 300 to the key assembly 300', the ready/return mechanism 360 may be termed a biasing mechanism, and it is configured to bias the keycap 350 away from the base 380. Also, the magnetically coupled components 362, 364 enable the ready/return mechanism 360 to use magnetic forces to bias the keycap 350. In response to press force applied to the keycap 350, the ready/return mechanism 360 resists keycap movement toward the pressed position. And, in response to a removal of the press force, the ready/return mechanism 360 biases the keycap 350 toward the unpressed position. Further, any number of variations of the ready/return mechanism 360 are possible, including any of the ones discussed in conjunction with the ready/return mechanism 320.

Some embodiments of the key assembly 300' also include a PTE mechanism 370 that differs from that of the key assembly 330. The PTE mechanism 370 is based on linkages instead of ramps. The PTE mechanism 370 comprises a first linkage 371 rotatably coupled to the base 380 and the keycap 350, and a second linkage 372 rotatably coupled to the base 380 and the keycap 350. The rotatable coupling may be accomplished in any number of ways. The specific depiction in FIGS. 3C-3D shows no intermediate components or complex joints. It illustrates the first linkage 371 as comprising a first base coupling portion rotatably coupled to the base 380 at a first base revolute joint 381 and a first keycap coupling portion rotatably coupled to the keycap 350 at a first keycap revolute joint 351. It also illustrates the second linkage 372 as comprising a second base coupling portion rotatably coupled to the base 380 at a second base revolute joint 382 and a second keycap coupling portion rotatably coupled to the keycap 350 at a second keycap revolute joint 352. In other embodiments, the first or second linkage 371 or 372 has linear shapes, or the first or second linkage 371 or 372 is not in direct contact with the base 380 or keycap 350, and is indirectly coupled through one or more intermediate components. Together, the keycap 350, first and second linkages 381, and the base 380 form a linkage system that defines the translational and rotational motion allowed of the keycap 350.

As shown in FIG. 3C, in the unpressed position, the linkage 371 forms a first angle $\theta_{1u}$ with the base 380, and the second linkage 372 forms a second angle $\theta_{2u}$ with the base 380. The first angle $\theta_{1u}$ is the angle formed by the base 380 with a line connecting the first keycap revolute joint 351 and the first base revolute joint 381. Similarly, the second angle $\theta_{2u}$ is the angle formed by the base 380 with a line connecting the second keycap revolute joint 352 and the second base revolute joint 382. Where the base 380 is not strictly planar, a best-fit plane or a plane orthogonal to the press direction (negative-Z direction) can be used.

FIG. 3C shows $\theta_{1u}$ as being substantively equal to $\theta_{2u}$, the length of the first linkage 371 being substantially equal to the length of the second linkages 372, and the distance between the first and second keycap revolute joints 351, 352 being substantially equal to the distance between the first and second base revolute joints 371, 372. The lengths of the first and second linkages 371, 372 are measured between the corresponding keycap revolute joints 351, 352 and base revolute joints 371, 372, respectively. This configuration creates a parallelogram-type linkage system, and keeps the keycap 350 level when moving between the unpressed and pressed positions. Thus, the first and second linkages together maintain the keycap 350 in a substantially constant orientation relative to the base 380 while guiding the keycap 350 toward the pressed position. The first and second linkages also guide the keycap 350 to move along an arc, such that a point on the keycap 350 traces out an arc with a radius of the length of one of the linkages. Manufacturing and assembly tolerances will often cause some amount of non-idealized response, but the keycap 350 would appear to users as not rotating about any axis and keeping the same orientation when moving between unpressed and pressed positions.

FIG. 3D shows the key assembly 300' in the pressed position, where the lengths and distances described above have not changed, but the angles between the first and second linkages 371, 372 with the base 380 have changed. As shown in FIGS. 3C-3D, these pressed-keycap angles $\theta_{1p}$ and $\theta_{2p}$ are equal to each other, but are less than $\theta_{1u}$ and $\theta_{2u}$. These angles thus have changed by the amounts $(\theta_{1u}-\theta_{1p})$ and $(\theta_{2u}-\theta_{2p})$. The keycap 350 also travelled along the press direction (negative-Z direction) from the unpressed to the pressed position. Using the notation as shown in FIGS. 3C-3D, this vertical component of keycap 350 motion can be expressed as $(h_u-h_p)$. Similarly, using the notation as shown in FIGS. 3C-3D the lateral component of keycap 350 motion from the unpressed to the pressed positions can be expressed as $(d_u-d_p)$.

Thus, the keycap 350 moves a first amount in the press direction and a second amount in a lateral direction orthogonal to the press direction. These first and second amounts may have any ratio allowed by the physical constraints of the assembly. One may be many times the other, for example. In some embodiments, the first amount in the press direction is at least as much as the second amount and no larger than twice the second amount in the lateral direction. That is, the first amount is equal or greater to the second amount, and less than or equal to twice the second amount. In some embodiments, the first amount vertically downwards in the press direction ranges from 0.5 mm to 1.4 mm, and the second amount laterally ranges from 0.25 or 0.30 mm to 0.7 mm. The specific amount of motion is defined by the specific design of the assembly. For example, the physical details of the keycap 350, linkages 371 and 372, and base 380 impose some limits on the motion. In some embodiments, features on these or other components, or additional components or mechanisms, physically limit the motion of the keycap 350.

The angles $\theta_{1u}$, $\theta_{2u}$, $\theta_{1p}$, $\theta_{2p}$ may be any angle allowed by the physical limits of the system. In some embodiments, in the unpressed position, the angle between the first or second linkage 371, 372 and the base 380 ($\theta_{1u}$, $\theta_{2u}$) are no less than forty-five (45) degrees and less than sixty-five (65) degrees. That is, one or both of $\theta_{1u}$, $\theta_{2u}$ are equal or greater to 45 degrees. In some embodiments, in the pressed position, the angle between the first or second linkage 371, 372 and the base 380 ($\theta_{1p}$, $\theta_{2p}$) are no less than negative five (−5) degrees and less than fifteen (15) degrees. That is, one or both of $\theta_{1p}$, $\theta_{2p}$ are equal or greater to −5 degrees. In many embodiments, $\theta_{1p}$, $\theta_{2p}$ are no less than zero (0) degrees. In various embodiments of the key assembly 300', the path of keycap travel and the associate displacement components in different directions may be defined by particular values of $\theta_{1u}$, $\theta_{2u}$, $\theta_{1p}$, and $\theta_{2p}$, and the distance between the revolute joints of each linkage 371, 372.

In other embodiments, one or more of the angles, lengths, or distances related to the linkages 371, 372 that are described above may differ and be unequal, such that the motion, change in angle, vertical component of travel, or lateral component of travel of the keycap 350 deviates from that described above. In some embodiments, the linkage system or other components of the key assembly 300' are configured such that the motion of a first part of the keycap 350 differs from a second part of the keycap 350. This can be accomplished in numerous ways, including by rotating of the keycap 350 about one or more axes, by introducing compliance to one or more components of the key assembly 300' such that not all parts move with rigid body motion, and the like.

FIGS. 3C-3D do not show the width of the key assembly 300' (in the Y direction), and it will be appreciated that the cross section may be constant or vary through the width. For example, the magnetically coupled components 362, 364 may extend through only part of the width of the keycap 350. As another example, the width of the keycap 350 may be less than the width of the base 380. As yet another example, the cross section of linkage 371 shown in FIGS. 3C-3D may extend partially or entirely through the width of the keycap 350. That is, the linkage 371 may extend a tenth or an eighth of the width of the keycap 350, and be located only on one (the left) side of the keycap 350; or, the linkage 371 may extend mostly through the width of the keycap 350. Similar options apply to the linkage 372.

Where the linkage 371 or the linkage 372 extends through only partially through the width of the keycap 350, and where linkages 371, 372 are the only parts of the PTE 370 coupled to the keycap 350 and the base 380, the keycap 350 generally has a greater likelihood of tilting. This is largely due to reduced support on one side of the keycap 350. Thus, many embodiments with linkage 371 or 372 substantially thinner than the width of the keycap 350 include one or more additional linkages (not shown) similar to the thinner linkage on the opposite (right) side of the key assembly 300', near an opposite (right) edge of the keycap 350. In embodiments where such additional linkage(s) exist, the previous discussion regarding angles, lengths, distances, and such also apply.

Figure 4:
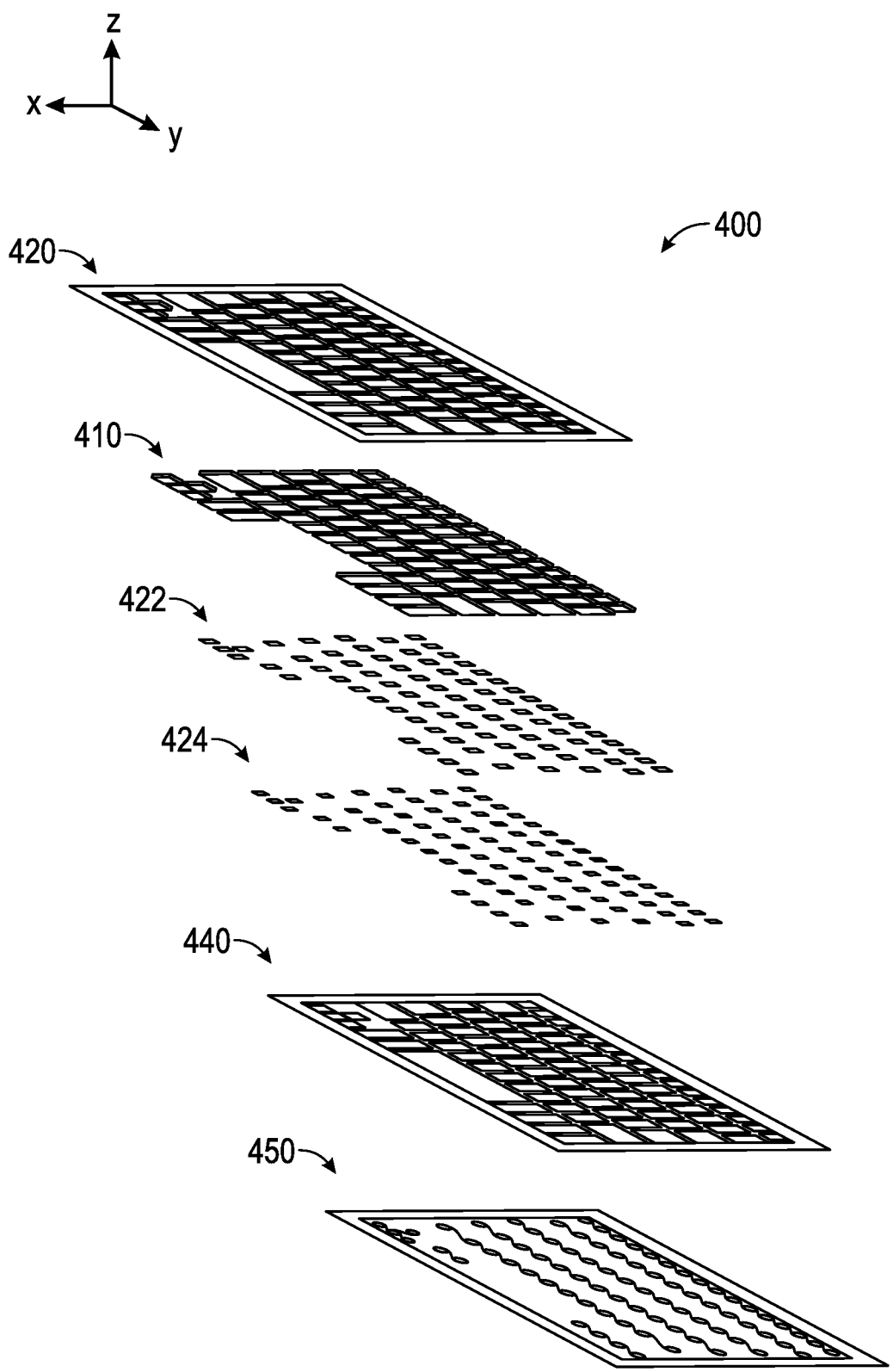
FIG. 4 shows an exploded view of an example keyboard in accordance with the techniques described herein

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5A:
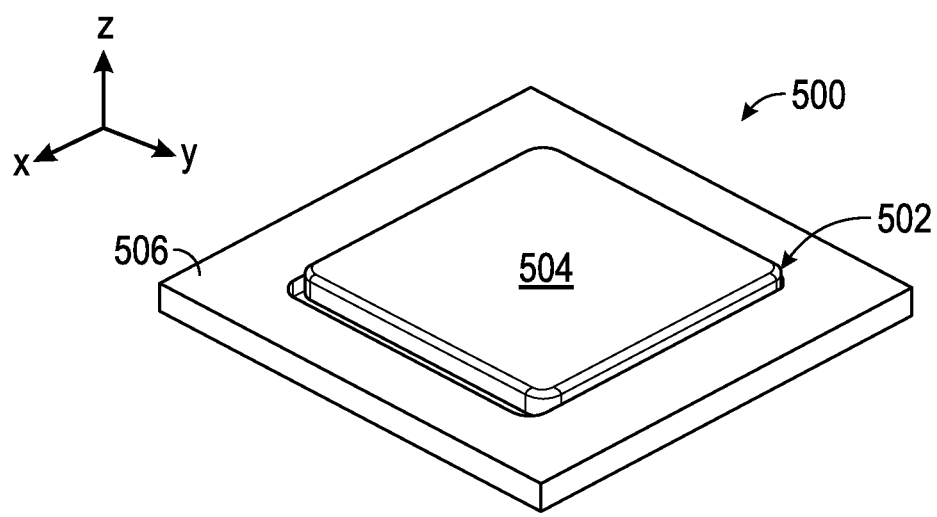
FIGS. 5A, 5B, 5C, 5D, 5E, and 5F are simplified views of a key assembly configured in accordance with the techniques described herein.
Figure 5B:
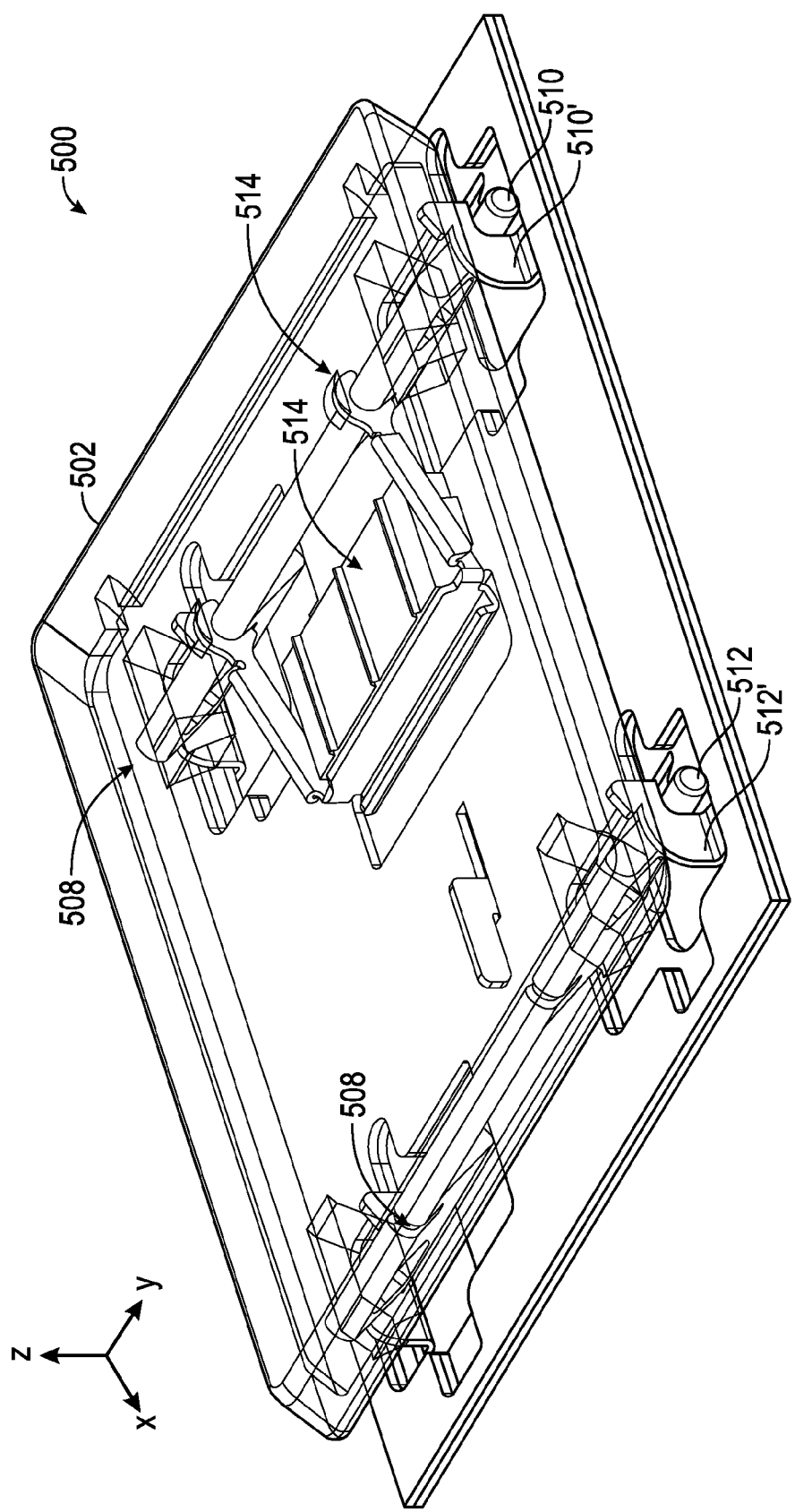

FIGS. 5A-5E are simplified views of a key assembly 500. The key assembly 500 may be used to implement various keys, including the key 122 of the keyboard 100. FIG. 5A shows a perspective view of the key assembly 500 that includes a keycap 502 having a touch surface 504 and a bezel 506. FIG. 5B illustrates the key assembly 500 with a transparent keycap 502 to show the planar-translation effecting (PTE) mechanism 508 of the key assembly 500. As will be appreciated, the PTE mechanism 508 comprises a 4-bar assembly (see discussion of FIGS. 3C-3D above) having a first bar 510 and the second bar 512. The first bar 510 pivots around a retention feature 510' as the keycap 502 moves from the unpressed position towards the pressed position. Similarly, the second bar 512 pivots about a retention feature 512' as the keycap 502 moves towards the pressed position. In some embodiments, the retention features 510' and 512' are formed in a substrate layer of the key assembly 500. When a press force is applied to the keycap 502, the keycap 502 moves in the direction of the press force (for example, the negative Z direction) and also in a direction orthogonal to the press direction (for example, the positive X direction) as the keycap moves from the un-pressed position toward the pressed position. In a keyboard embodiment, (see discussion of FIG. 4) the press direction is generally downward towards the base of the keyboard and the orthogonal direction is a direction lateral to the downward Movement of the keycap. During the translation from the un-pressed position toward the pressed position, the PTE mechanism 508 keeps the keycap 502 level (i.e., substantially reducing pitch, roll and yaw).

Figure 5C:
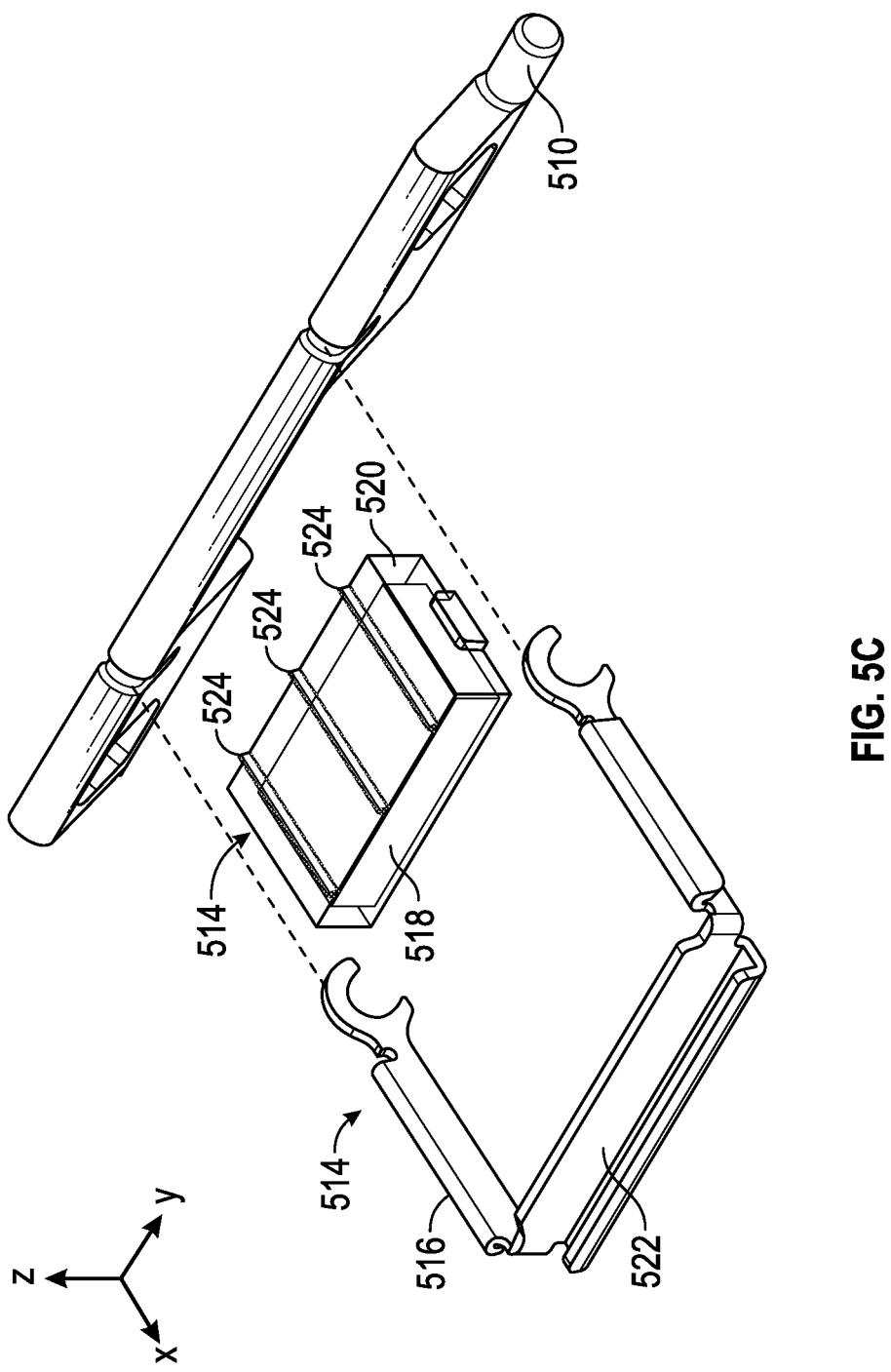
Figure 5D:
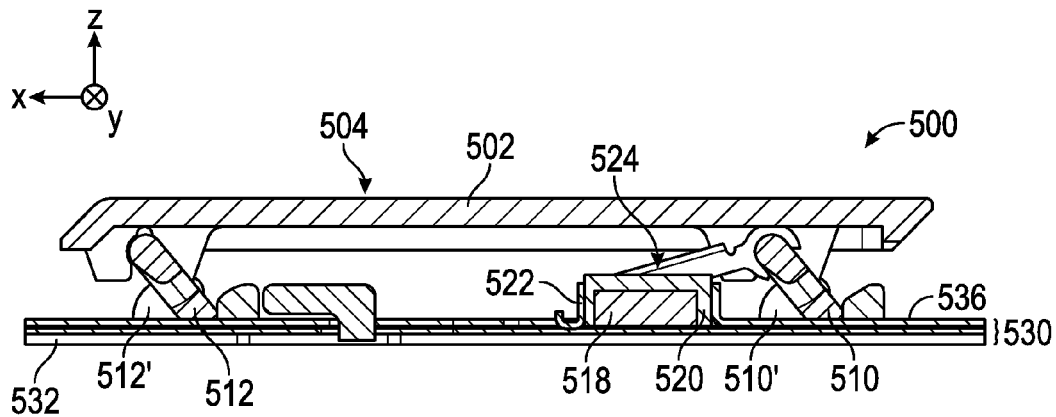

The key assembly 500 also includes a ready-return mechanism 514 that is shown in an exploded view in FIG. 5C. The ready-return mechanism 514 includes a slider mechanism 516 and a magnet 518 that is mechanically coupled to a substrate layer of the key assembly 500 by retaining feature 520. As can be seen in FIG. 5C, the slider mechanism 516 couples to the first bar 510 to form a 5-bar configuration that allows the slider mechanism 516 to translate away from the magnet 518 (in this example, the positive X direction) as the first bar 510 pivots when the keycap 502 moves from the unpressed position toward the pressed position. In some embodiments, the retention feature 520 is made of a compliant material to provide an end stop for the keycap 502 as it reaches the pressed position. In some embodiments, the retention feature also includes cushioning elements 524 to provide a cushioned end stop for the keycap 502. The slider mechanism 516 includes a surface 522 made of a ferromagnetic material (or has a ferromagnetic coating)

making it magnetically attracted to the magnet 518, which holds the keycap 502 in a ready position when the keycap 502 is in the un-pressed position as shown in FIG. 5D.

In some embodiments, the retention feature 520 provides an up stop feature for the keycap 502 as it returns to the unpressed position. The retention feature 520 provides a spacing between surface 522 of slider mechanism 516 and the magnet 518. The retention feature 520 and/or cushioning elements 524 provide a cushioning effect when the keycap returns to the unpressed position.

Figure 5E:
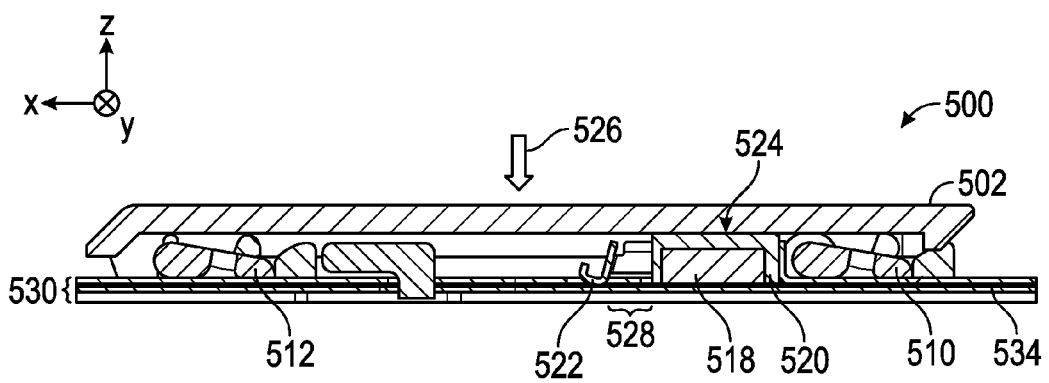

Referring now to FIGS. 5D-5E, when a press force 526 is applied to the touch surface 504 that overcomes the magnetic attraction between the surface 522 and the magnet 518, the slider mechanism 516 translates away from the magnet 518 (as indicated by 528) as the keycap 502 moves towards the pressed position (FIG. 5E). Upon release of the press force 526, the magnetic attraction between the surface 522 of the slider mechanism 516 and the magnet causes the keycap 502 to return to the un-pressed (ready) position where the surface 522 of the slider mechanism 516 abuts the magnet retention feature 520 that provides an up-stop and cushioning effect for the keycap 502. FIGS. 5D-5E also illustrate some of the substrate since layers 530 of the stack-up of the key assembly 500. The substrate layer 530 provides a base or chassis for the key assembly 500. A sensor layer 534 is utilized to sense when the keycap 502 moves from the un-pressed position toward the pressed position. In some embodiments, the sensor layer 534 can also determine the amount of translation of the slider mechanism 516 from the magnet 518 using capacitive sensing techniques. In some embodiments, the key assembly 500 also includes a carrier layer 536 that provides the advantage of a key retraction feature to reduce the profile of the key assembly 500 when not in use. As compared to the configuration of the FIGS. 3C-D, an advantage is offered by the embodiment of FIGS. 5A-E by having the magnet 518 and the ready-return mechanism 514 positioned entirely under the keycap 502. As can be seen in FIGS. 3C-D, the magnetic component 364 resides in a portion of the base 380 outside the perimeter of the keycap 350. Typically, a bezel would be used to cover this portion of the base resulting in a keyboard arrangement known as a "chicklet" keyboard. In contrast, the embodiment of FIGS. 5A-E does not require a chicklet bezel (unless desired) and more typical keyboard configurations can be realized.

Figure 5F:
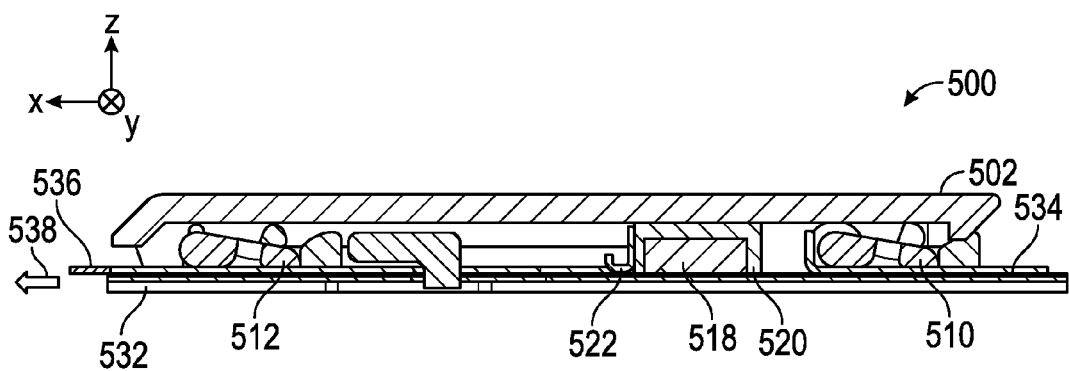

Referring now to FIG. 5F the carrier layer 536 is shown translated relative to the sensor layer 534 and the substrate 532 (as indicated by arrow 538). This causes the magnet 518 (and the magnet retention feature 520) to translate with the carrier layer 536 pushing the slider mechanism 516 forward which pulls down the first bar 510 retracting the keycap 502 two a retracted position. In some embodiments, the retracted position is substantially the same as the pressed position. In other embodiments, the retracted position may not fully reach the pressed position but retracts the keycap 502 to be substantially flush with the bezel (506 of FIG. 5A) or to another level as desired any particular implementation to reduce the profile of the key assembly 500 when not in use. When the carrier layer 536 is returned to its original position (FIG. 5D) the magnetic attraction between the magnet 518 and the slider mechanism 516 returns the keycap 502 to the ready position.

As will be appreciated, as the keycap 502 moves towards the retracted position the sensor layer 534 would detect a change in capacitance due to the movement of the carrier layer 536. In some embodiments, the processing system (190 of FIG. 1) disregards or ignores detected capacitive changes upon detecting the carrier layer 536 translating the keycap 502 toward the retracted position. In other embodiments, the carrier layer 536 and the sensor layer 534 both translate together relative to the chassis substrate layer 532 retracting the keycap 502 without causing a sensed capacitive change. In other embodiments, the carrier layer 536 is translated relative to the sensor layer 534 wherein movement of the magnet 518 and slider mechanism 516 over sensor electrodes disposed on the sensor layer 534 is measured by the processing system (190 of FIG. 1). The retraction of the keys is determined by the processing system based on a change in capacitance measured by the sensor electrodes disposed on the sensor layer, beneath the keycap.

Figure 6A:
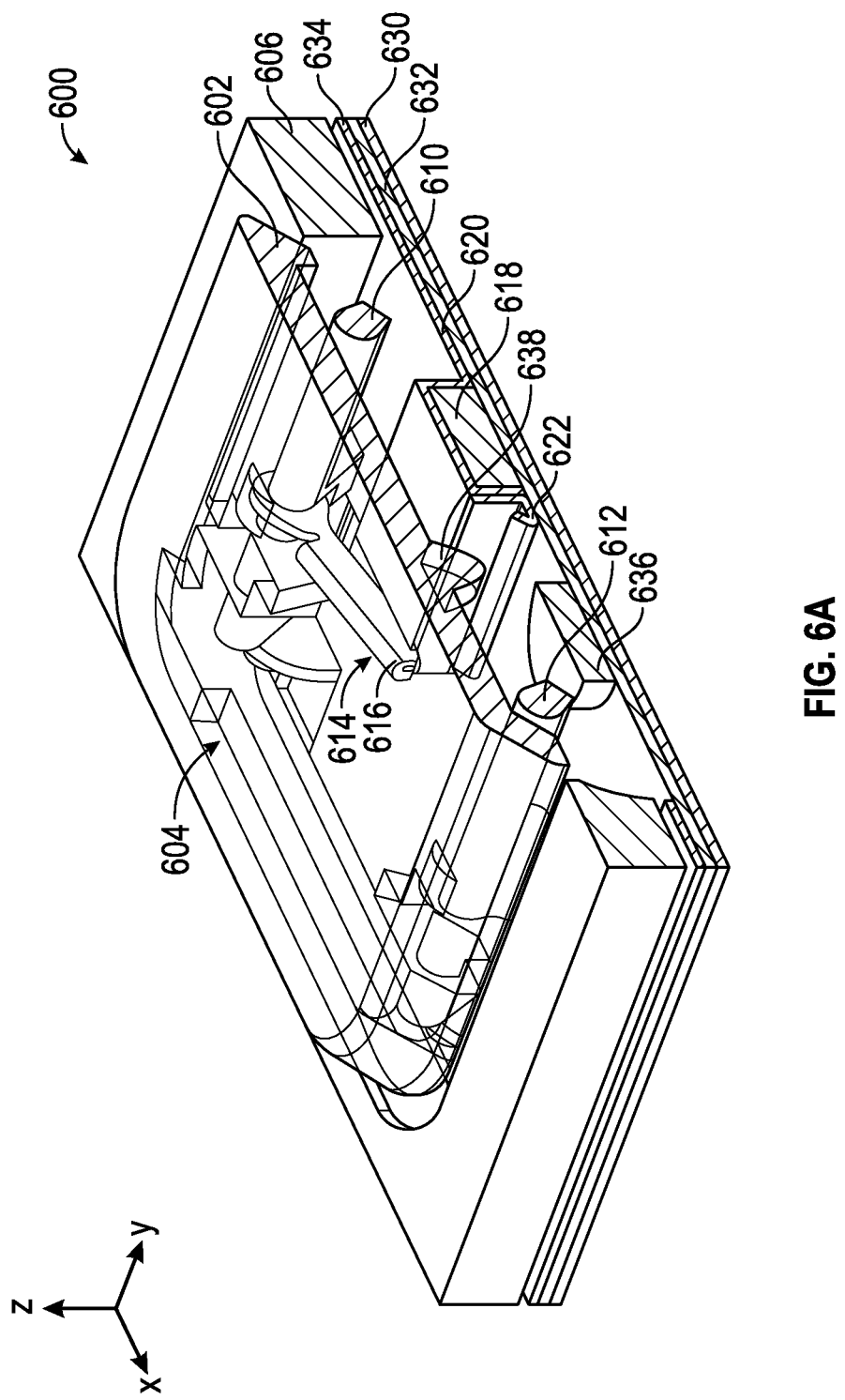
FIGS. 6A and 6B are simplified views of another key assembly configured in accordance with the techniques described herein.
Figure 6B:
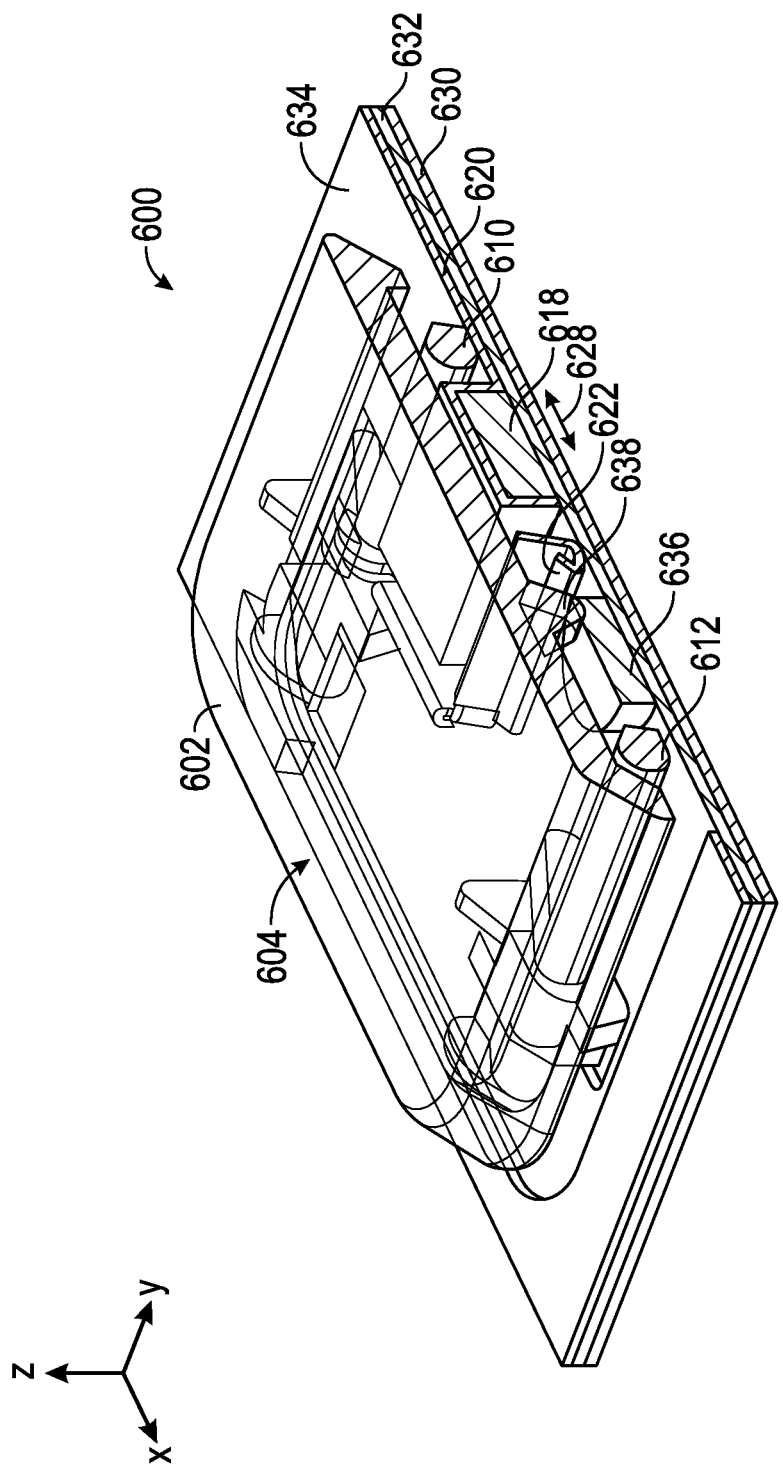

FIGS. 6A-6B are simplified views of a key assembly 600 that has a similar construction to the key assembly 500. The key assembly 600 may be used to implement various keys, including the key 122 of the keyboard 100. FIG. 6A illustrates a cross-sectional perspective view of the key assembly 600 in the un-pressed (ready) position. The key assembly 600 includes the keycap 602 having a touchsurface 604 for receiving a press force and a bezel 606. A 4-bar PTE mechanism 614 includes a first bar 610 and a second bar 612. The key assembly 600 also includes a ready-return mechanism including a slider mechanism 616 and a magnet 618. As discussed above, the PTE mechanism 614 and the slider assembly 616 form a 5-bar configuration that allows the slider mechanism 616 to translate away from the magnet 618 when a press force applied to the touchsurface 604 exceeds the magnetic attraction between a ferromagnetic surface 622 of the slider mechanism and the magnet 618. When this occurs, the keycap moves from the un-pressed position toward the pressed position illustrated in FIG. 6B (note the bezel 606 has been removed for clarity of illustration). As discussed in connection with FIG. 5, when a press force is applied to the keycap 602, the keycap 602 moves in the direction of the press force (for example, the negative Z direction) and also in a direction orthogonal to the press direction (for example, the positive X direction) as the keycap moves from the un-pressed position toward the pressed position.

The embodiment of the key assembly 600 includes an end-stop 636 and an end-stop plunger 638. This configuration is useful for embodiments where it is not desirable for the magnet retention feature 620 to be the end-stop for the keycap 602 or for when alternative techniques are employed to capture the magnet 618 (e.g., adhesives). As can be seen in FIG. 6B, as the keycap 602 moves toward the pressed position the end-stop plunger 638 contacts the end-stop 636 at the pressed position. Upon release of the press force, the magnetic attraction between the ferromagnetic surface 622 and the magnet 618 return the keycap to the un-pressed (ready) position.

Figure 7A:
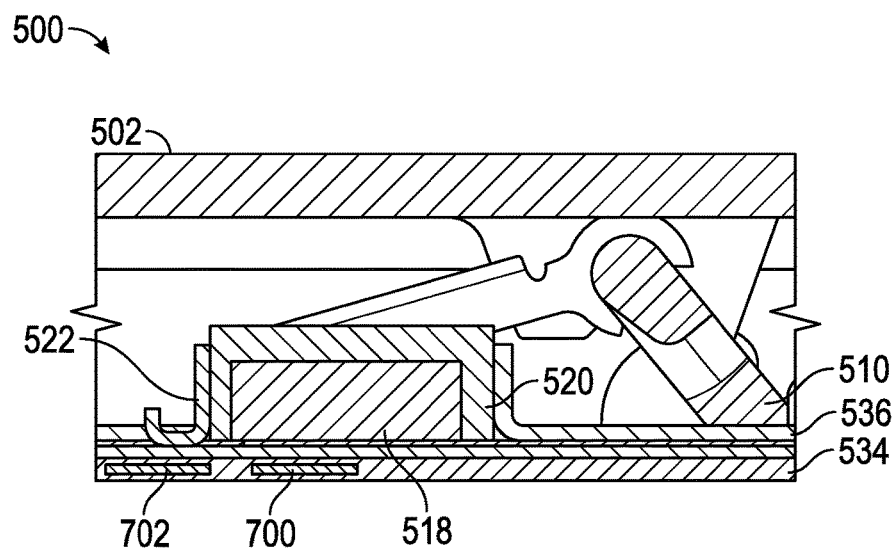
FIGS. 7A and 7B are partial cross-sectional side views to illustrate the capacitive sensing in accordance with the techniques described herein.
Figure 7B:
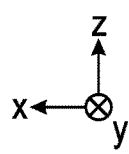
Figure 7B:
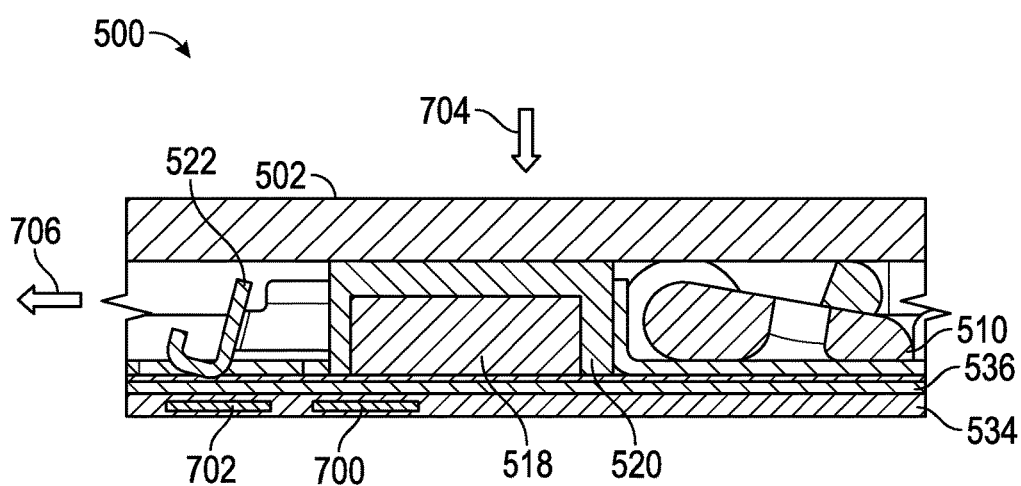

FIGS. 7A-7B are partial cross-sectional side views of the keycap 500 of FIG. 5 to illustrate the capacitive sensing provided by the sensing substrate layer 534. The sensing substrate layer 534 includes a first electrode 700 and a second electrode 702. In some embodiments, the first electrode 700 is a transmit electrode and the second electrode 702 is a receive electrode. When a press force 704 is applied to the keycap 502 sufficient to overcome the magnetic attraction between the slider mechanism 516 and the magnet 518 the slider surface 522 translates away from the magnet 518 as indicated by arrow 706 (in the positive X direction). Since the slider surface 522 is made of a ferromagnetic material the capacitive coupling between the first electrode 700 and the second electrode 702 will change as the ferromagnetic mass above the electrode 702 changes to the translation effect of the slider mechanism 516. The capacitive coupling is schematically illustrated in FIG. 8A.

Figure 8A:
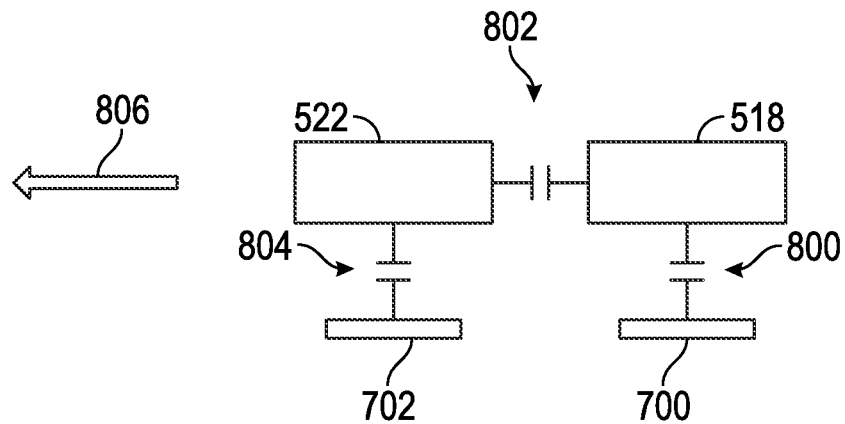
FIG. 8A is a schematic illustration of the capacitive coupling of FIGS. 7A and 7B.

In FIG. 8A, capacitive coupling 800 is formed between the first electrode 700 and the magnet 518. Capacitive coupling 802 also exists between the magnet 518 and the slider surface 522. Additionally, there is capacitive coupling 804 between the second electrode 702 and the slider surface 522. As will be appreciated, when the slider surface 522 translates away from the magnet 518 (as indicated by arrow 806) the capacitive coupling 804 between the second electrode 702 and the slider surface 522 will begin to decline while the capacitive coupling 800 between the first electrode 700 and the magnet 518 remained essentially constant. Additionally, the capacitive coupling 802 between the slider surface 522 and the magnet 518 will rapidly (and exponentially) decline as shown in FIG. 8B.

Figure 8B:
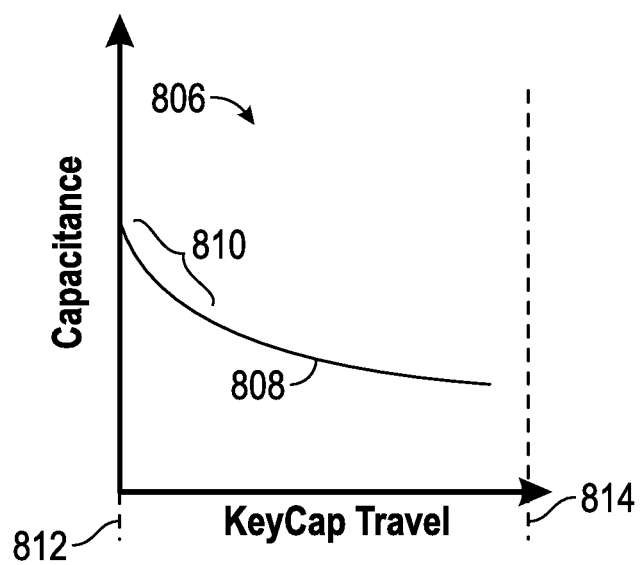
FIG. 8B is a graph illustrating the capacitive coupling decline during keycap travel in accordance with the techniques described herein.

FIG. 8B is a graph 806 of a signal 808 representing the change in capacitive coupling 802 between the slider surface 522 and the magnet 518 during keycap travel from the un-pressed position 812 toward the press position 814. As will be appreciated, in the capacitance configuration 800, 802 and 804 of FIG. 8A, the capacitive coupling 802 between the slider surface 522 and the magnet 518 is the smallest capacitive coupling and therefore will dominate in the capacitive addition of the three capacitances 800, 802 and 804. As can be seen in FIG. 8B, this provides a rapid capacitive decline in the early portion of keycap travel from the un-press position 812 towards the pressed position 814. Generally, the early rapid capacitive decline provided by the configuration of FIG. 8A, provides a faster and more accurate capacitive sensing of a key press than conventional sensing arrangements that sense keycap travel toward the sensor electrodes. As will be appreciated, the conventional sensing arrangements detect and increasing capacitance as the keycap moves towards the sensing electrodes resulting in press detection at a much later point in keycap travel toward the pressed position.

Figure 8C:
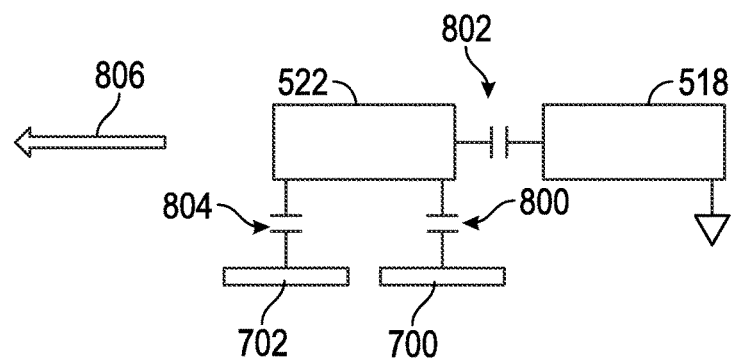
FIG. 8C is a schematic illustration of an alternative capacitive coupling configuration in accordance with the techniques described herein.

In FIG. 8C, an alternate sensing arrangement is illustrated where both the first electrode 700 and the second electrode 702 are positioned beneath and capacitively coupled to the slider surface 522. In this configuration, the magnet 518 is coupled to a reference potential (e.g., ground). As will be appreciated, when the slider surface 522 translates away from the magnet 518 (as indicated by arrow 806) the capacitive coupling 804 between the second electrode 702 and the slider surface 522 and the capacitive coupling 800 between the first electrode 700 and the magnet 518 will begin to decline. Additionally, the capacitive coupling 802 between the slider surface 522 and the magnet 518 will rapidly (and exponentially) decline as shown in FIG. 8B. As noted above, the early rapid capacitive decline provided by the configuration of FIG. 8C, provides a faster and more accurate capacitive sensing of a key press than conventional sensing arrangements that sense keycap travel toward the sensor electrodes.

Figure 9:
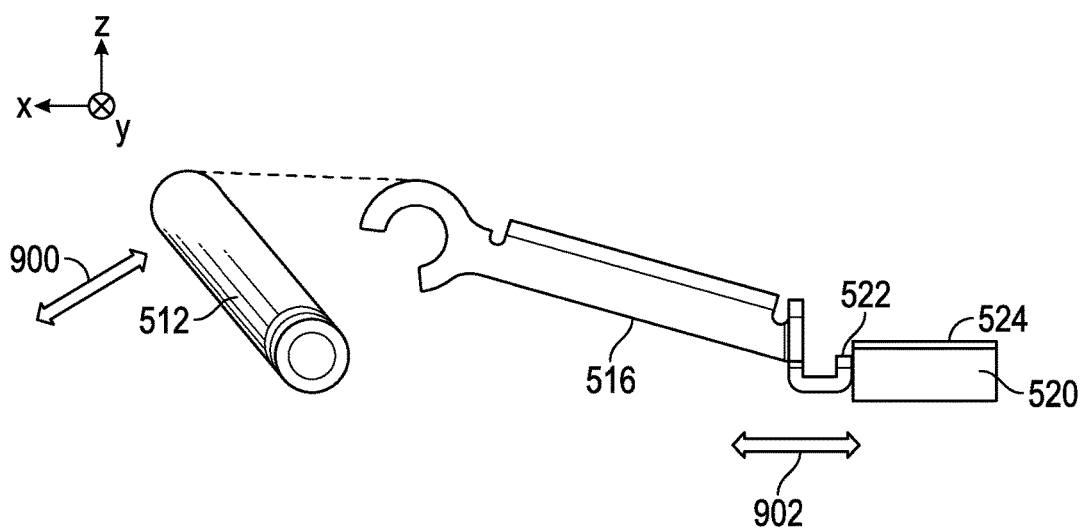
FIG. 9 is an illustration of an alternative coupling configuration between the slider mechanism and the PTE mechanism in accordance with the techniques described herein.

The techniques described herein can be used to implement any number of devices utilizing different key assemblies, including a variety of keyboards each comprising one or more key assemblies in accordance with the techniques described herein. One example is shown in FIG. 9 where the slider mechanism 516 is instead coupled to the second bar 512 as opposed to the first bar 510 as we shown in connection with FIGS. 5A-5E. in the un-pressed position, the ferromagnetic slider surface 522 abuts the magnet retention feature 520. As the keycap translates toward the pressed position, the second bar 512 pivots as indicated by the arrow 900 causing the slider mechanism 516 to translate away from the magnet as indicated at 902. Thus, in this embodiment, the slider mechanism 516 is pulled away from the magnet as opposed to the embodiment of FIGS. 5A-5E or the slider mechanism was pushed away and the magnet.

Figure 10:
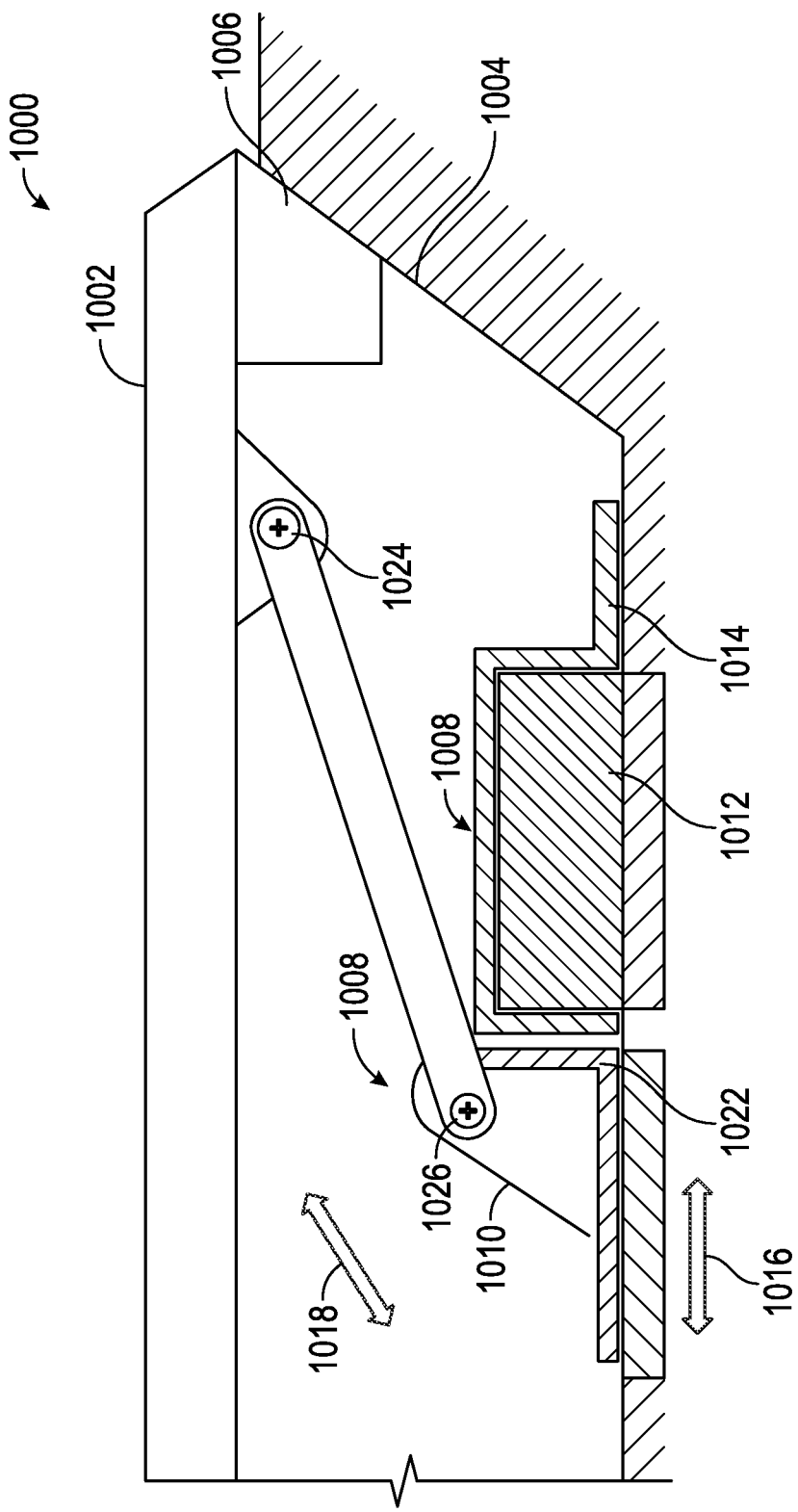
FIG. 10 is an illustration of an alternative key assembly utilizing the PTE mechanism of FIGS. 3A and 3B in accordance with the techniques described herein.

Another example is illustrated in FIG. 10. In this embodiment, the key assembly 1000 employees a PTE mechanism utilizing ramps 1004 and ramp contacting features 1006 (see discussion of FIGS. 3A-3B above). The key assembly 1000 includes a ready-return mechanism 1008 that includes a slider mechanism 1010 and a magnet 1012 that is coupled to the substrate layers by a magnet retention feature 1014. In this embodiment, the slider mechanism 1010 is coupled to the keycap 1002 that will push the slider mechanism 1010 away from the magnet 1012 (as indicated by arrow 1016) as the ramp contacting feature 1006 travel down the ramp 1004 as the keycap 1002 moves toward the press position (as indicated by arrow 1018). Upon release of the press force, the magnetic attraction between the magnet 1012 and the slider mechanism 1010 will cause the ramp contacting feature 1006 to move up the ramp 1004 to return the keycap 1002 two the ready position. An advantage offered by this embodiment is that the orientation of the magnetic surface 1022 remains parallel to the magnet 1012 due to the operation of pivots 1024 and 1026 during movement toward the pressed position and return movement toward the ready position.

Thus, the techniques described herein can be used to implement any number of devices utilizing different key assemblies, including a variety of keyboards each comprising one or more key assemblies in accordance with the techniques described herein. Some components may be shared when multiple key are placed in the same device. For example, the base (chassis) substrate layer may be shared by two or more key assemblies. As another example, the key assembly sensor may be shared through sharing sensor substrates, sensor electrodes, or the like.

The implementations described herein are meant as examples, and many variations are possible. As one example, any appropriate feature described with one implementation may be incorporated with another.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to back-up or augment magnetically-based ready/return mechanisms.

What is claimed is:

1. A key assembly, comprising:
   a keycap having a touch surface for receiving a press input from a user;
   a planar-translation-effecting (PTE) mechanism configured to guide the keycap in a press direction and a second direction orthogonal to the press direction in response to the press input as the keycap moves from an un-pressed position toward a press position;

a ready-return mechanism configured to bias the keycap in the un-pressed position, the ready-return mechanism including a slider mechanism positioned beneath the keycap and coupled to one of the keycap and the PTE mechanism, the slider mechanism being magnetically attracted toward a magnet positioned beneath the keycap and coupled to a substrate of the key assembly;

a processing system configured to determine an amount of translation of the slider mechanism from the magnet based upon a varying capacitance between the slider mechanism and the magnet as the keycap moves from the un-pressed position toward the press position; and a capacitive sensing circuit coupled to the processing system and having a first sensor electrode positioned beneath the magnet and a second sensor electrode positioned beneath the slider mechanism in the un-pressed position, wherein, as the slider mechanism translates away from the magnet, the processing system is configured to determine a change in capacitance between the first sensor electrode and the second sensor electrode as the keycap moves from the un-pressed position toward the press position, and wherein, when the press surface receives a press input sufficient to overcome the magnetic attraction between the slider mechanism and the magnet, the slider mechanism translates away from the magnet as the PTE mechanism guides the keycap from the un-pressed position toward the pressed position.

2. The key assembly of claim 1, wherein the PTE mechanism comprises one of a four-bar mechanism or ramp mechanism.

3. The key assembly of claim 1, further comprising an end-stop positioned on the substrate such that the slider mechanism abuts the end-stop in the press position.

4. The key assembly of claim 1, wherein the magnet is coupled to the substrate by a retention feature mechanically coupled the substrate.

5. The key assembly of claim 4, wherein the keycap abuts the retention feature includes key cushioning features configured to provide a key-stop in the press position.

6. The key assembly of claim 4, wherein the slider mechanism abuts the retention feature in the un-pressed positioned position to provide an up-stop.

7. The key assembly of claim 4, wherein the retention feature is formed of a compliant material to cushions the keycap as the keycap moves from the un-pressed position to the press position and cushions the slider mechanism as the keycap moves from the press position to the un-pressed position.

8. The key assembly of claim 1, wherein the processing system also determines the amount of translation of the slider mechanism from the magnet based upon a change in capacitance between the slider mechanism and the second sensor electrode as the keycap moves from the un-pressed position toward the press position.

9. The key assembly of claim 1, wherein the processing system is configured to transmit a sensing signal from the first sensor electrode and receive a resulting signal from the second sensor electrode.

10. The key assembly of claim 1, wherein the magnet is coupled to a reference potential, and further comprising a capacitive sensing circuit coupled to the processing system and having the first sensor electrode and the second sensor electrode positioned beneath the slider mechanism, and wherein, as the slider mechanism translates away from the magnet, the processing system is configured to determine the change in capacitance between the slider mechanism and the magnet via the first sensor electrode and the second sensor electrode as the keycap moves from the un-pressed position toward the press position.

11. A key assembly, comprising: a keycap having a touch surface for receiving a press input from a user; a planar-translation-effecting (PTE) mechanism configured to guide the keycap in a press direction and a second direction orthogonal to the press direction in response to the press input as the keycap moves from an un-pressed position toward a press position; a ready-return mechanism configured to bias the keycap in the un-pressed position, the ready-return mechanism including a slider mechanism positioned beneath the keycap and coupled to one of the keycap and the PTE mechanism, the slider mechanism being magnetically attracted toward a magnet positioned beneath the keycap and coupled to a substrate of the key assembly; and a processing system configured to determine an amount of translation of the slider mechanism from the magnet based upon a varying capacitance between the slider mechanism and the magnet as the keycap moves from the un-pressed position toward the press position, wherein the processing system is configured to determine a change in capacitance between the slider mechanism and a first sensor electrode and a second sensor electrode positioned at least partially beneath the slider mechanism as the keycap moves from the un-pressed position toward the press position.

12. The key assembly of claim 1, wherein as the substrate is translated relative to a base of the key assembly, the resulting translation of the magnet and the slider mechanism causes the PTE mechanism to move the keycap from the un-pressed position toward a retracted position.

13. The key assembly of claim 12, wherein the processing system is coupled to a sensing layer positioned beneath the keycap, wherein the processing system detects capacitive changes via the sensing layer as the keycap moves from the un-pressed position toward the press position.

14. The key assembly of claim 13, wherein the processing system is configured to sense translation of the magnet relative to the base and disregard detected changes in capacitance as the keycap moves from the un-pressed position to the retracted position.

15. The key assembly of claim 13, wherein the sensing layer also translates with the substrate relative to the base of the key assembly.

16. A keyboard, comprising:
a plurality of keycaps each having a touch surface for receiving a press input from a user;
a plurality of magnets, each respective magnet of the plurality of magnets positioned on a substrate and beneath one of the plurality of keycaps;
a plurality of planar-translation-effecting (PTE) mechanisms, each PTE mechanism of the plurality of PTE mechanisms is configured to guide a respective keycap of the plurality of keycaps in a vertical direction and a lateral direction in response to the press input as the respective keycap moves from an un-pressed position toward a press position;
a plurality of ready-return mechanisms, each ready-return mechanism associated with a respective PTE mechanism and configured to bias the respective keycap in the un-pressed position, each ready-return mechanism including a respective slider mechanism positioned beneath the respective keycap and coupled to one of the respective keycap and the respective PTE mechanism, the respective slider mechanism being magnetically attracted toward the respective magnet positioned beneath the respective keycap; and a processing system configured to determine an amount of translation of the respective slider mechanism from the respective magnet based upon a varying capacitance between the respective slider mechanism and the magnet as the respective keycap that is moves from the un-pressed position toward the press position; and a capacitive sensing circuit coupled to the processing system and having a respective first sensor electrode positioned beneath each respective magnet and a respective second sensor electrode positioned beneath each respective slider mechanism in the un-pressed position, wherein, as the respective slider mechanism translates away from the respective magnet, the processing system is configured to determine a change in capacitance between the respective first sensor electrode and the respective second sensor electrode as the respective keycap moves from the un-pressed position toward the press position, and wherein, when the touch surface receives the press input sufficient to overcome a magnetic attraction between the respective slider mechanism and the respective magnet, the respective slider mechanism translates away from the respective magnet as the respective PTE mechanism guides the respective keycap from the un-pressed position toward the pressed position.

17. The keyboard of claim 16, wherein each PTE mechanism of the plurality of PTE mechanisms comprise one of a four-bar mechanism or ramp mechanism.

18. The keyboard of claim 16, further comprising a plurality of end-stops positioned on the substrate such that the each respective slider mechanism abuts one of the plurality of end-stops when the respective keycap is in the press position.

19. The keyboard of claim 16, wherein the each respective magnet is coupled to the substrate by a respective retention feature of a plurality of retention features each being mechanically coupled to the substrate and wherein each respective keycap abuts the respective retention feature in the press position to provide a key-stop.

20. The keyboard of claim 19, wherein each respective retention feature is formed of a compliant material that cushions the respective keycap as the respective keycap moves from the un-pressed position to the press position and cushions the respective slider mechanism as the respective keycap moves from the press position to the un-pressed position.

21. The keyboard of claim 16, wherein the processing system is further configured to determine the amount of translation of the respective slider mechanism from the respective magnet based upon a change in capacitance between the respective slider mechanism and the respective second sensor electrode as the respective keycap moves from the un-pressed position toward the press position.

22. The keyboard of claim 16, wherein as the substrate is translated relative to a base of the keyboard, the resulting translation of the plurality of magnets and each respective slider mechanism causes the respective PTE mechanism to move the respective keycap from the un-pressed position toward a retracted position.

* * * * *

UNITED STATES PATENT AND TRADEMARK OFFICE
CERTIFICATE OF CORRECTION

PATENT NO. : 9,947,493 B2
APPLICATION NO. : 14/523208
DATED : April 17, 2018
INVENTOR(S) : VanDee Moua et al.

Page 1 of 1

It is certified that error appears in the above-identified patent and that said Letters Patent is hereby corrected as shown below:

In the Claims

Claim 4, Column 19, Line 39, the word -- to -- should be inserted between the words "coupled" and "the".

Claim 7, Column 19, Line 47, the word "cushions" should read -- cushion --.

Signed and Sealed this
Eighteenth Day of June, 2019

Andrei Iancu
*Director of the United States Patent and Trademark Office*